US012575462B2

(12) United States Patent
Chen

(10) Patent No.: US 12,575,462 B2
(45) Date of Patent: Mar. 10, 2026

(54) DISPLAY DEVICE AND FABRICATION METHOD THEREOF

(71) Applicant: AUO Corporation, Hsinchu (TW)

(72) Inventor: Peng-Yu Chen, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 437 days.

(21) Appl. No.: 18/460,715

(22) Filed: Sep. 5, 2023

(65) Prior Publication Data

US 2024/0371837 A1 Nov. 7, 2024

(30) Foreign Application Priority Data

May 3, 2023 (TW) ................................. 112116498

(51) Int. Cl.
*H01L 25/075* (2006.01)
*H01L 21/66* (2006.01)
*H01L 25/16* (2023.01)
*H10H 20/851* (2025.01)
*H10H 20/01* (2025.01)

(52) U.S. Cl.
CPC .......... *H01L 25/0753* (2013.01); *H01L 22/30* (2013.01); *H01L 25/167* (2013.01); *H10H 20/8513* (2025.01); *H10H 20/0361* (2025.01)

(58) Field of Classification Search
CPC ... H01L 25/0753; H01L 25/167; H01L 22/30; H10H 20/8513; H10H 20/0361
See application file for complete search history.

(56) References Cited

U.S. PATENT DOCUMENTS

| | | | |
|---|---|---|---|
| 11,189,761 B2 | 11/2021 | Akimoto | |
| 11,728,463 B2 | 8/2023 | Akimoto | |
| 2015/0318328 A1* | 11/2015 | Bibl | ........................ H01L 24/82 |
| | | | 257/89 |
| 2020/0212269 A1 | 7/2020 | Akimoto | |
| 2021/0091257 A1 | 3/2021 | Hwang et al. | |
| 2022/0059735 A1 | 2/2022 | Akimoto | |

(Continued)

FOREIGN PATENT DOCUMENTS

| | | |
|---|---|---|
| CN | 110137220 | 8/2019 |
| CN | 110416388 | 11/2019 |

(Continued)

*Primary Examiner* — Anne M Hines
(74) *Attorney, Agent, or Firm* — JCIPRNET

(57) ABSTRACT

A display device includes a circuit substrate, light-emitting diodes, a bank structure, and light-transmission structures. The circuit substrate includes first sub-pixel areas, wherein each first sub-pixel area includes a placement area and a repair area. At least one corresponding light-emitting diode is disposed on at least one of the placement area and the repair area of each first sub-pixel area. The bank structure is located above the circuit substrate and has second sub-pixel areas. The first sub-pixel areas are overlapped with the second sub-pixel areas respectively. Each second sub-pixel area includes a preset opening and a repair opening. The preset openings are overlapped with the placement areas, and the repair openings are overlapped with the repair areas. The light-transmission structures are disposed in the second sub-pixel areas. Each light-transmission structure is disposed in one corresponding preset opening or in one corresponding repair opening.

15 Claims, 26 Drawing Sheets

(56)        References Cited

U.S. PATENT DOCUMENTS

| | | |
|---|---|---|
| 2022/0231079 A1 | 7/2022 | Lee et al. |
| 2023/0036183 A1* | 2/2023 | Xu ........................ H01L 25/167 |
| 2023/0290919 A1* | 9/2023 | Chung ................ H01L 25/0753 |
| 2023/0335688 A1 | 10/2023 | Akimoto |

FOREIGN PATENT DOCUMENTS

| | | |
|---|---|---|
| CN | 114744084 | 7/2022 |
| CN | 115274479 | 11/2022 |
| TW | 202030904 | 8/2020 |
| TW | 202318695 | 5/2023 |

* cited by examiner

212

210

C'

C

D2

D1

F3

F2

F1

F3

F2

F1

C

D2

D1

DISPLAY DEVICE AND FABRICATION METHOD THEREOF

CROSS-REFERENCE TO RELATED APPLICATION

This application claims the priority benefit of Taiwan application serial no. 112116498, filed on May 3, 2023. The entirety of the above-mentioned patent application is hereby incorporated by reference herein and made a part of this specification.

BACKGROUND OF THE INVENTION

Field of the Invention

The invention relates to a display device and a fabrication method thereof.

Description of Related Art

The micro light-emitting diode display (micro LED display) is a new generation of display technique, and the key technique thereof is how to transfer a large number of micro LEDs onto a pixel array substrate. Generally, if there is a deviation in the transfer process of the micro LEDs, some micro LEDs may not be disposed at the correct position in the sub-pixels. At this time, it is necessary to repair these erroneous sub-pixels via a repair process.

SUMMARY OF THE INVENTION

At least one embodiment of the invention provides a display device including a circuit substrate, a plurality of light-emitting diodes, a bank structure, and a plurality of light-transmission structures. The circuit substrate includes a plurality of first sub-pixel areas, wherein each of the first sub-pixel areas includes a placement area and a repair area. At least one corresponding light-emitting diode is disposed on at least one of the placement area and the repair area of each of the first sub-pixel areas. The bank structure is located above the circuit substrate and has a plurality of second sub-pixel areas. The first sub-pixel areas are overlapped with the second sub-pixel areas respectively. Each of the second sub-pixel areas includes a preset opening and a repair opening. The preset openings are overlapped with the placement areas, and the repair openings are overlapped with the repair areas. The light-transmission structures are disposed in the second sub-pixel areas. Each of the light-transmission structures is disposed in one corresponding preset opening or in one corresponding repair opening. A number of the light-transmission structures in each of the second sub-pixel areas is one.

At least one embodiment of the invention provides a fabrication method of a display device, including the following steps. A circuit substrate is provided, wherein the circuit substrate includes a plurality of first sub-pixel areas, and each of the first sub-pixel areas includes a placement area and a repair area. A plurality of light-emitting diodes are disposed on the circuit substrate, including: performing one or a plurality of transfer processes, wherein the light-emitting diodes of a first portion are successfully disposed on the placement areas of the first sub-pixel areas of a first portion after the transfer process; performing a detection process to confirm that the first sub-pixel areas of a second portion of the light-emitting diodes that may function normally are not successfully disposed after the one or plurality of transfer processes; performing one or a plurality of repair processes to dispose the light-emitting diodes of a second portion on the repair areas of the first sub-pixel areas of the second portion. A bank structure is formed, wherein the bank structure has a plurality of second sub-pixel areas, each of the second sub-pixel areas includes a preset opening and a repair opening, the preset openings correspond to the placement areas, and the repair openings correspond to the repair areas. A plurality of light-transmission structures are formed in the second sub-pixel areas, wherein the light-transmission structures are disposed in the preset openings of the second sub-pixel areas of a first portion and in the repair openings of the second sub-pixel areas of a second portion, positions of the second sub-pixel areas of the first portion correspond to positions of the first sub-pixel areas of the first portion, and positions of the second sub-pixel areas of the second portion correspond to positions of the first sub-pixel areas of the second portion.

DESCRIPTION OF THE EMBODIMENTS

FIG. 1A to FIG. 1H are schematic top views of a fabrication method of a display device according to an embodiment of the invention. FIG. 2A to FIG. 2H are schematic cross-sectional views of a fabrication method of a display device according to an embodiment of the invention. FIG. 2A to FIG. 2C respectively correspond to the positions of line AA' and line BB' in FIG. 1A to FIG. 1C, and FIG. 2D to FIG. 2H respectively correspond to the position of line CC' in FIG. 1D to FIG. 1H.

Figure 1A:
FIG. 1A to FIG. 1H are schematic top views of a fabrication method of a display device according to an embodiment of the invention.
Figure 2A:
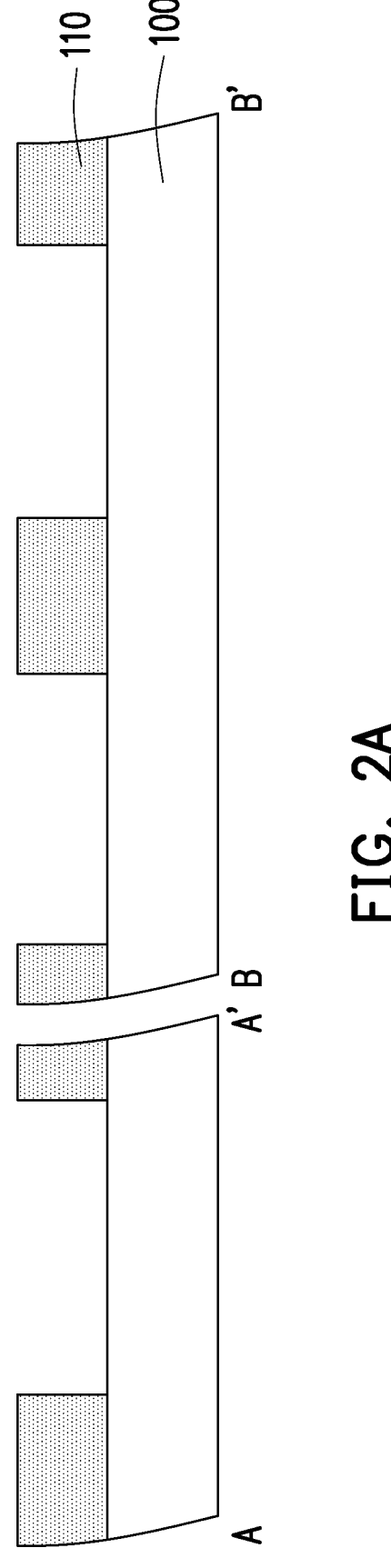
FIG. 2A to FIG. 2H are schematic cross-sectional views of a fabrication method of a display device according to an embodiment of the invention.
Figure 2B:
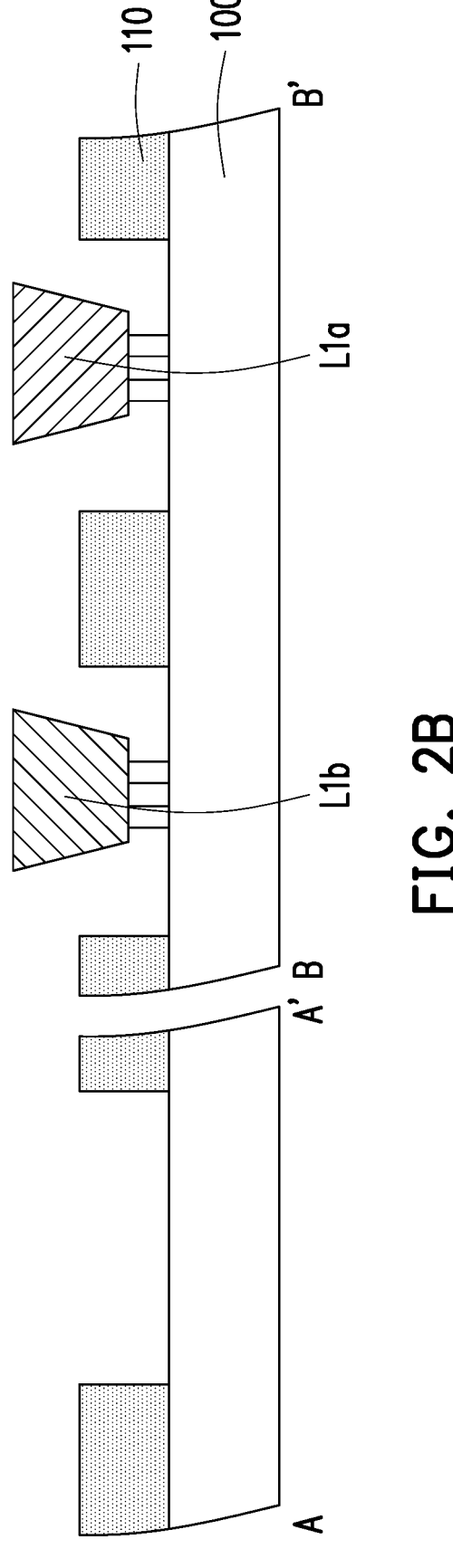
Figure 2C:
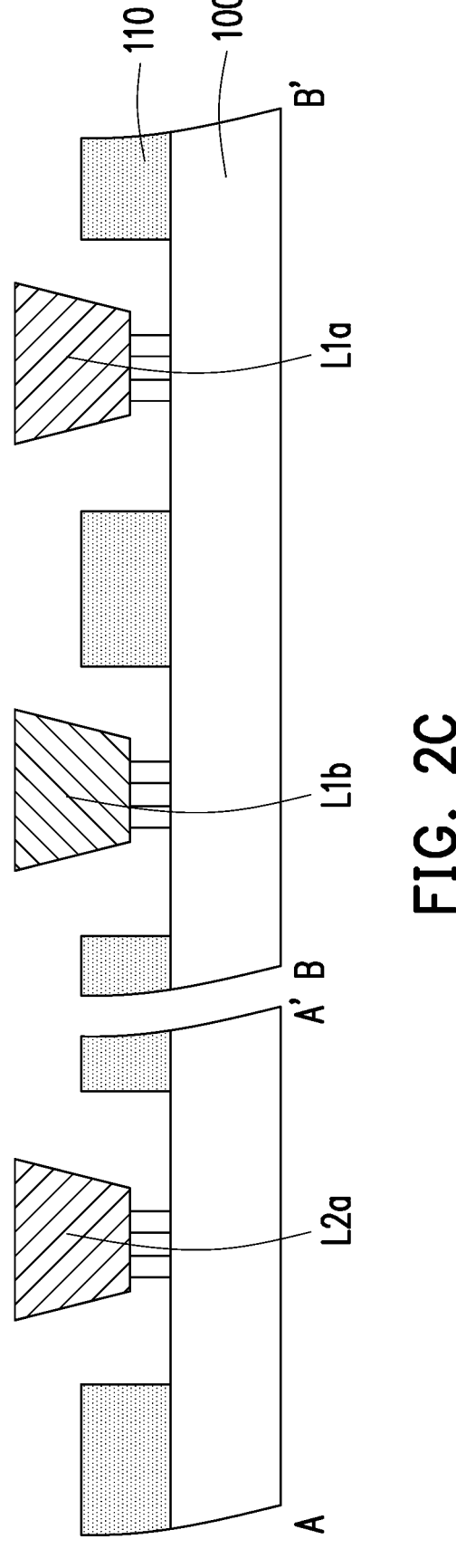

Referring to FIG. 1A and FIG. 2A, a circuit substrate 100 is provided, and the circuit substrate 100 includes a plurality of first sub-pixel areas SP1. Each of the first sub-pixel areas SP1 includes a placement area DP and a repair area RP. The placement areas DP are configured for placing preset LEDs, and the repair areas RP are configured for placing LEDs for repair. In some embodiments, a plurality of electrodes (not shown) are disposed in the placement areas DP and the repair areas RP.

In the present embodiment, the first sub-pixel areas SP1 are arranged in an array along a first direction D1 and a second direction D2, and the placement areas DP and the repair areas RP are alternately arranged in the first direction D1. In other embodiments, the placement areas DP and the repair areas RP in the first sub-pixel areas SP1 may also be arranged in other ways, and the invention does not limit the size and arrangement method of the placement areas DP and the repair areas RP.

In the present embodiment, a light-shielding layer 110 is located on the circuit substrate 100. The light-shielding layer 110 has a plurality of openings 112, and each of the placement areas DP and the repair areas RP is overlapped with one corresponding opening 112. In other words, the placement areas DP and the repair areas RP are separated by the light-shielding layer 110. In some embodiments, the light-shielding layer 110 includes a light-absorbing material, such as black resin, black metal, black oxide, or other suitable materials.

Referring to FIG. 1B to FIG. 1C and FIG. 2B to FIG. 2C, a plurality of light-emitting diodes L are disposed on the circuit substrate 100, wherein the light-shielding layer 110 surrounds the light-emitting diodes L. In the present embodiment, at least one corresponding light-emitting diode L is disposed on at least one of the placement area DP and the repair area RP of each of the first sub-pixel areas SP1.

Figure 1B:
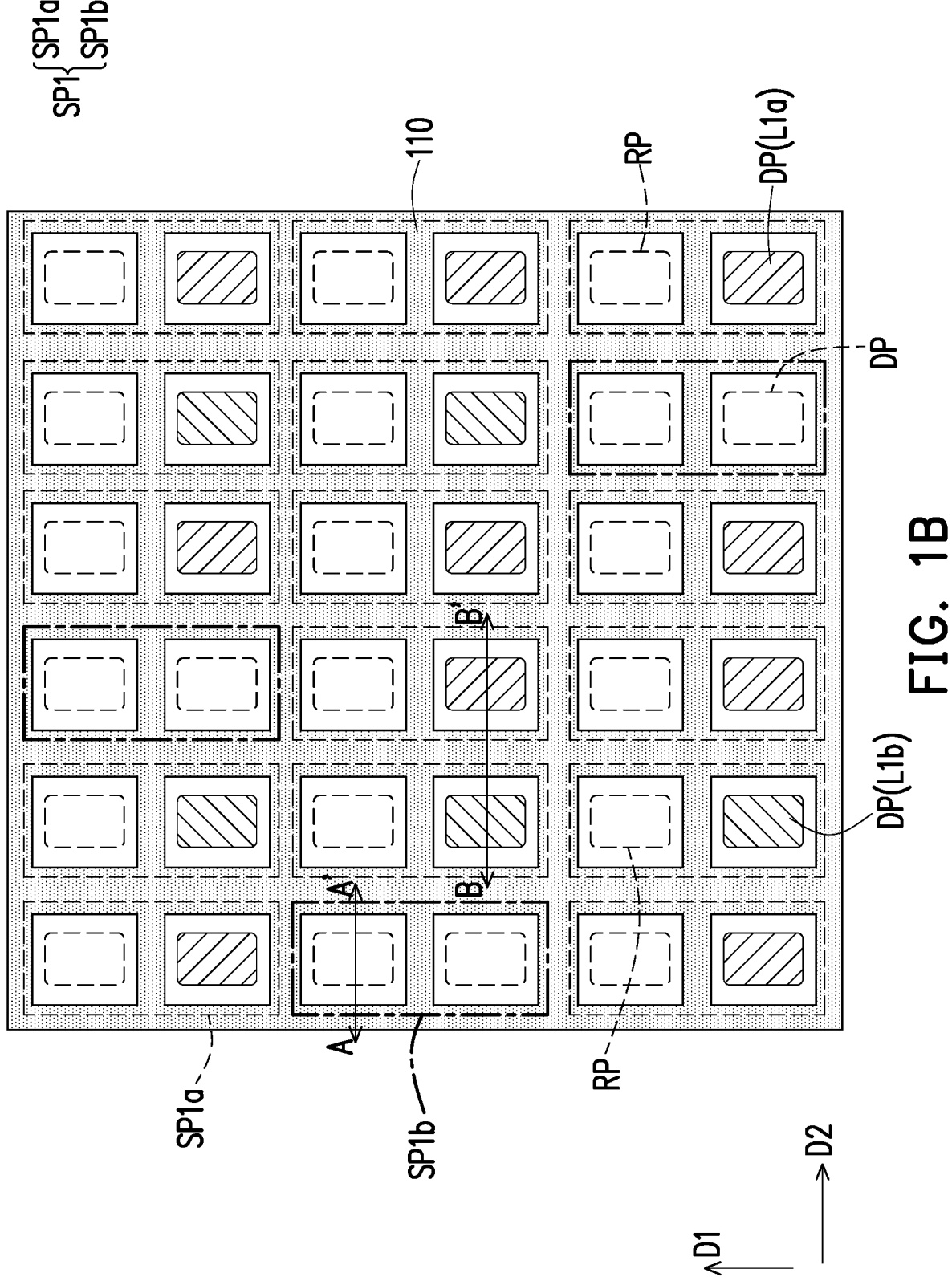

Referring to FIG. 1B and FIG. 2B, one or a plurality of transfer processes are performed, wherein light-emitting diodes L1a and L2b of a first portion are successfully disposed on the placement areas DP of first sub-pixel areas SP1a of the first portion after the transfer process.

In the present embodiment, the light-emitting diodes L1a and L1b of the first portion include two or more types of light-emitting diodes. For example, the light-emitting diodes L1a are blue light-emitting diodes, and the light-emitting diodes L1b are green light-emitting diodes. The blue light-emitting diodes and the green light-emitting diodes are formed on different growth substrates respectively first, and then the blue light-emitting diodes and the green light-emitting diodes are transferred onto the circuit substrate 100 by a plurality of transfer processes.

In some embodiments, the light-emitting diodes L1a and L1b of the first portion are electrically connected to the circuit substrate 100 via soldering, conductive adhesive, or other methods.

After the transfer process, a detection process is performed to confirm first sub-pixel areas SP1b of the second portion of the light-emitting diodes L that may function normally are not successfully disposed. For example, the transfer process does not correctly place the light-emitting diodes L on the placement areas DP of the first sub-pixel areas SP1b of the second portion, or the light-emitting diodes L placed on the placement areas DP of the first sub-pixel areas SP1b of the second portion are faulty light-emitting diodes (not shown).

Figure 1C:
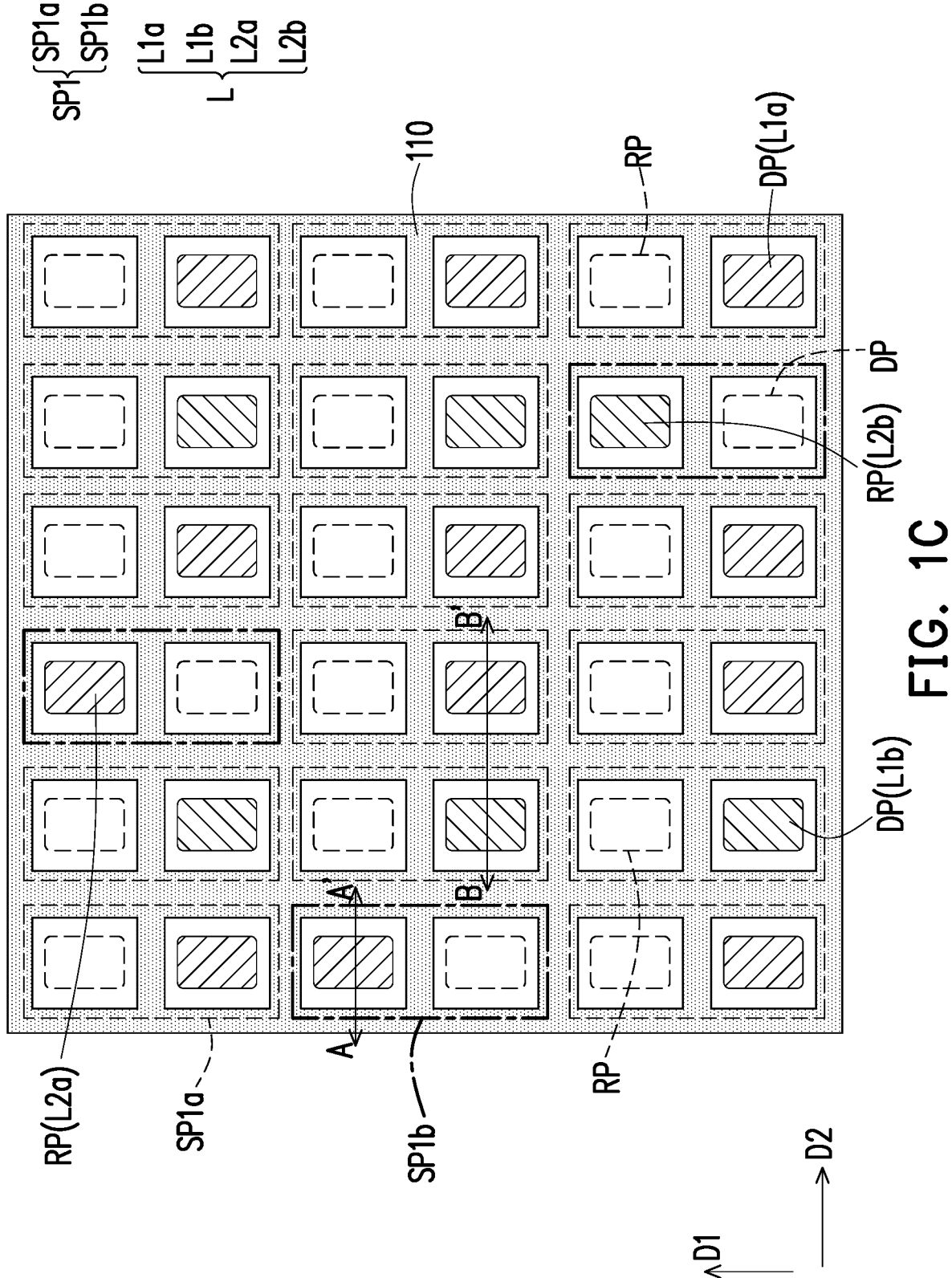

Next, please refer to FIG. 1C and FIG. 2C, one or a plurality of repair processes are performed to dispose light-emitting diodes L2a and L2b of the second portion on the repair areas RP of the first sub-pixel areas SP1b of the second portion.

In the present embodiment, the light-emitting diodes L2a and L2b of the second portion include two or more types of light-emitting diodes. For example, the light-emitting diodes L2a are blue light-emitting diodes, and the light-emitting diodes L2b are green light-emitting diodes. The blue light-emitting diodes and the green light-emitting diodes are formed on different growth substrates respectively first, and then the blue light-emitting diodes and the green light-emitting diodes are transferred onto the circuit substrate 100 by a plurality of transfer processes. In some embodiments, the light-emitting diodes L1a and L2a may be formed on the same growth substrate, and the light-emitting diodes L1b and L2b may be formed on the same growth substrate.

In some embodiments, the light-emitting diodes L2a and L2b of the second portion are electrically connected to the circuit substrate 100 via soldering, conductive adhesive, or other methods.

Referring to FIG. 1D to FIG. 1E and FIG. 2D to FIG. 2E, a black matrix 210 and color filter elements F1, F2, F3 are formed on a cover plate 200.

Figure 1D:
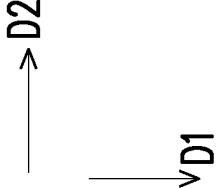
Figure 2D:
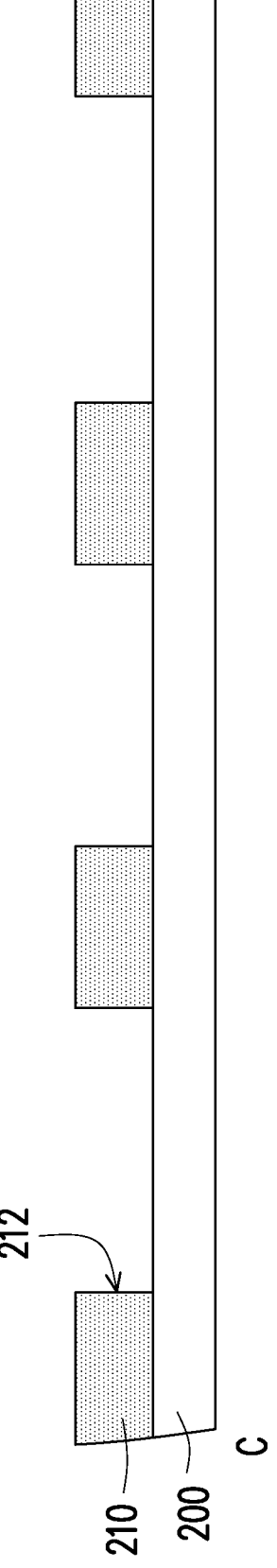

Please refer to FIG. 1D and FIG. 2D, the black matrix 210 is located on the cover plate 200. The black matrix 210 has a plurality of openings 212, and each of the openings 212 is designed to correspond to one corresponding opening 112 (please refer to FIG. 1A) of the light-shielding layer 110. In other words, each of the openings 212 corresponds to one corresponding placement area DP or one corresponding repair area RP. In the present embodiment, the black matrix 210 includes a plurality of first extending portions extended along the first direction D1 and a plurality of second extending portions extended along the second direction D2, and the first extending portions and the second extending portions are intersected with each other to form a plurality of openings 212, but the invention is not limited thereto. In other embodiments, the black matrix 210 only includes a plurality of first extending portions extended along the first direction D1. In some embodiments, the black matrix 210 includes a light-absorbing material, such as black resin, black metal, black oxide, or other suitable materials.

Figure 1E:
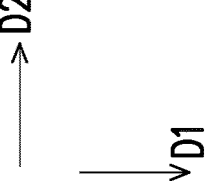
Figure 2E:
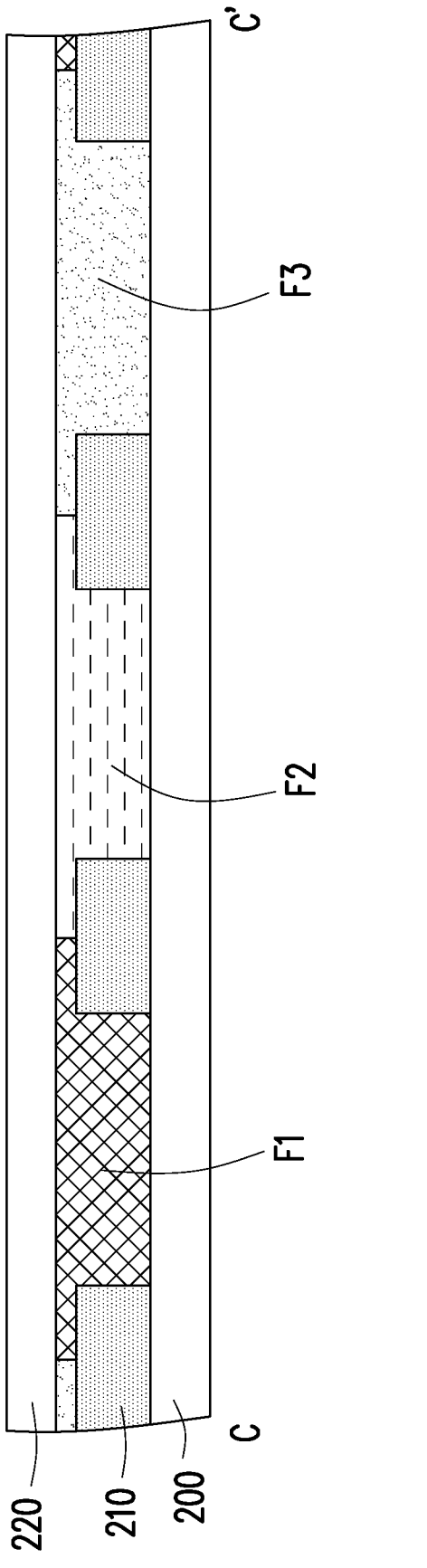

Please refer to FIG. 1E and FIG. 2E, the color filter elements F1, F2, F3 are located on the cover plate 200. In some embodiments, the color filter element F1 is a red filter layer, the color filter element F2 is a green filter layer, and the color filter element F3 is a blue filter layer. The color filter elements F1, F2, F3 are extended along the first direction D1 and filled in the openings 212 of the black matrix 210.

A first protection layer 220 is formed on the color filter elements F1, F2, F3. In some embodiments, the material of the first protection layer 220 includes silicon oxide, silicon nitride, silicon oxynitride, or other suitable materials.

Figure 1F:
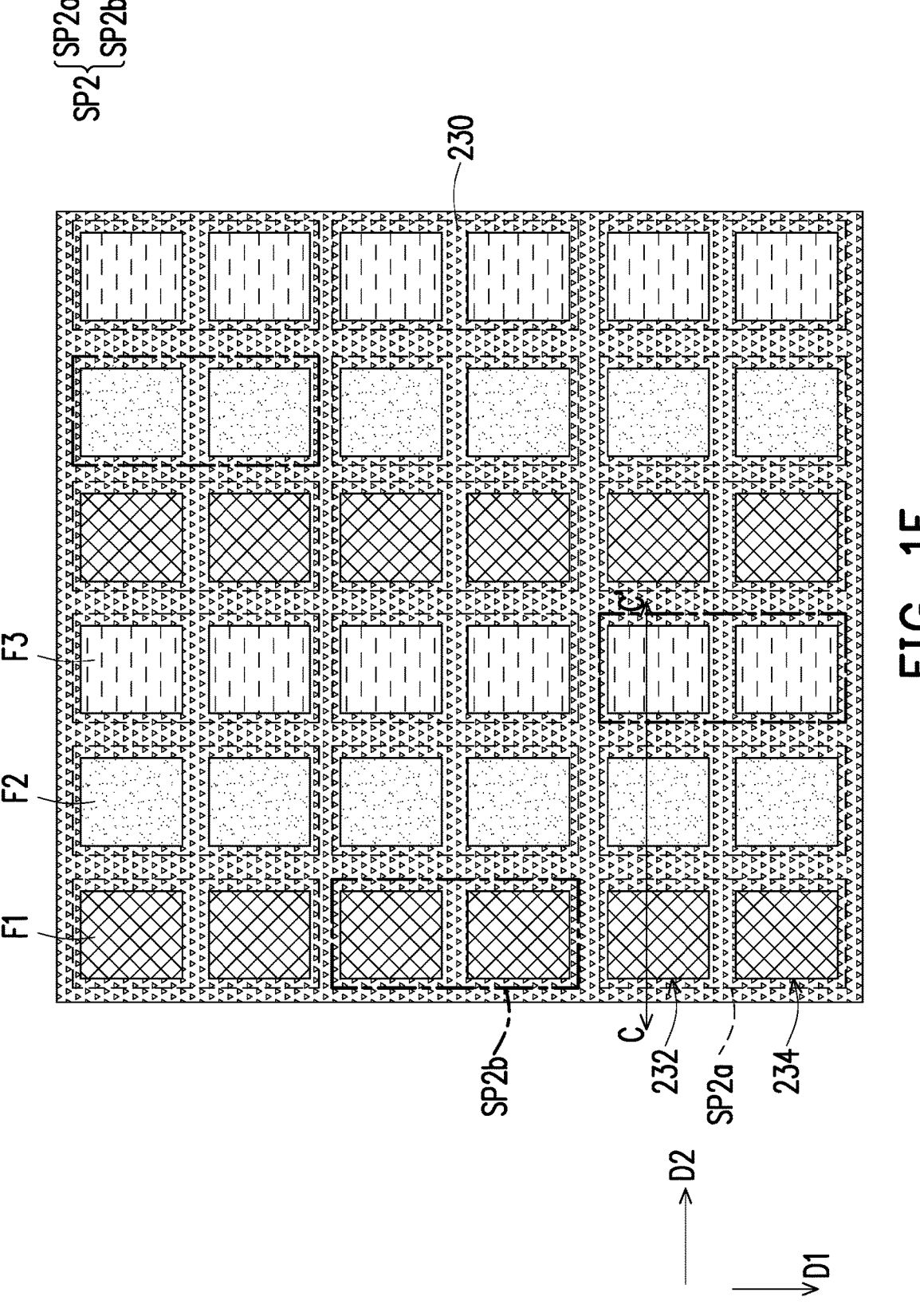
Figure 2F:
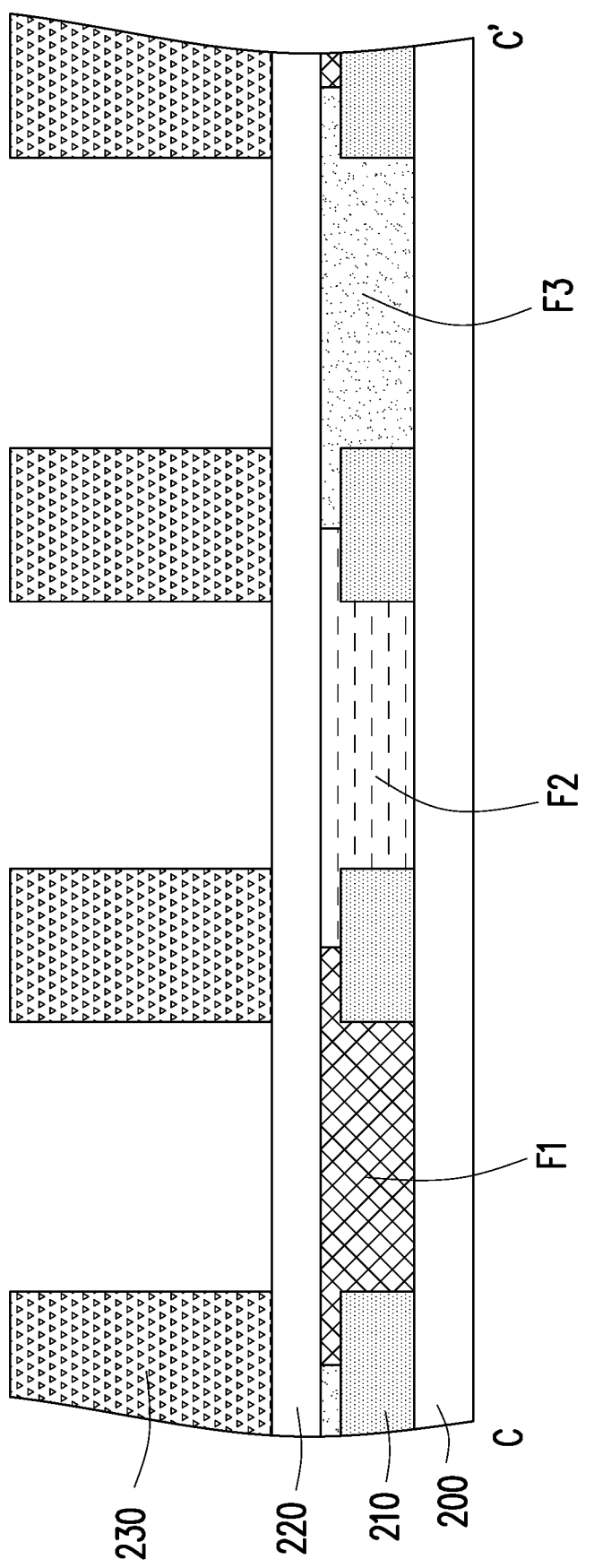

Referring to FIG. 1F and FIG. 2F, a bank structure 230 is formed. In the present embodiment, the bank structure 230 is formed on the first protection layer 220. The bank structure 230 has a plurality of second sub-pixel areas SP2. Each of the second sub-pixel areas SP2 includes a preset opening 232 and a repair opening 234. The preset openings 232 of the second sub-pixel areas SP2 are designed to correspond to the placement areas DP of the first sub-pixel areas SP1 (please refer to FIG. 1A), and the repair openings 234 of the second sub-pixel areas SP2 are designed to correspond to the repair areas RP of the first sub-pixel areas SP1 (please refer to FIG. 1A). Specifically, after the second sub-pixel areas SP2 are overlapped with the first sub-pixel areas SP1, the preset openings 232 are overlapped with the placement areas DP, and the repair openings 234 are over-lapped with the repair areas RP.

In the present embodiment, the second sub-pixel areas SP2 are arranged in an array along the first direction D1 and the second direction D2, and the preset openings 232 and the repair openings 234 are alternately arranged in the first direction D1. In other embodiments, the preset openings 232 and the repair openings 234 in the second sub-pixel areas SP2 may also be arranged in other ways, and the invention does not limit the size and arrangement method of the preset openings 232 and the repair openings 234.

In some embodiments, the bank structure 230 includes an organic material (such as photoresist) and a reflective material disposed on the surface of the organic material, but the invention is not limited thereto. In other embodiments, the bank structure 230 includes white resin, black resin, or other suitable materials, for example. In the present embodiment, the bank structure 230 has vertical sidewalls, but the invention is not limited thereto. In other embodiments, the bank structure 230 has a structure narrow at the top and wide at the bottom or narrow at the bottom and wide at the top.

In the present embodiment, based on the distribution of the first sub-pixel areas SP1a of the first portion and the first sub-pixel areas SP1b of the second portion obtained via the detection process, the second sub-pixel areas SP2 are divided into second sub-pixel areas SP2a of the first portion and second sub-pixel areas SP2b of the second portion, wherein the positions of the second sub-pixel areas SP2a of the first portion correspond to the positions of the first sub-pixel areas SP1a of the first portion, and the positions of the second sub-pixel areas SP2b of the second portion correspond to the positions of the first sub-pixel areas SP1b of the second portion. Specifically, after the second sub-pixel areas SP2 are overlapped with the first sub-pixel areas SP1, the second sub-pixel areas SP2a of the first portion are overlapped with the first sub-pixel areas SP1a of the first portion, and the second sub-pixel areas SP2b of the second portion are overlapped with the first sub-pixel areas SP1b of the second portion.

Figure 1G:
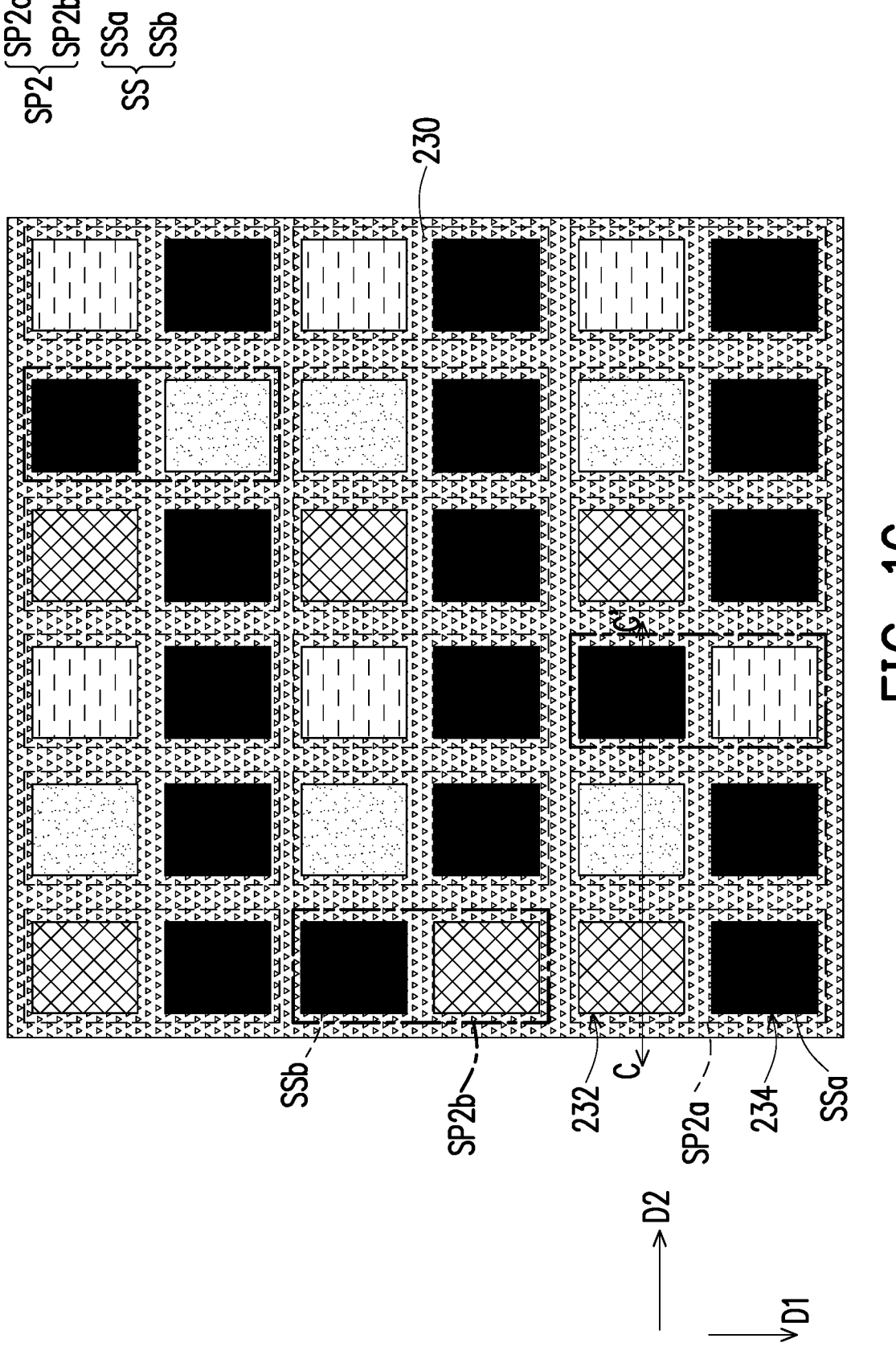
Figure 2G:
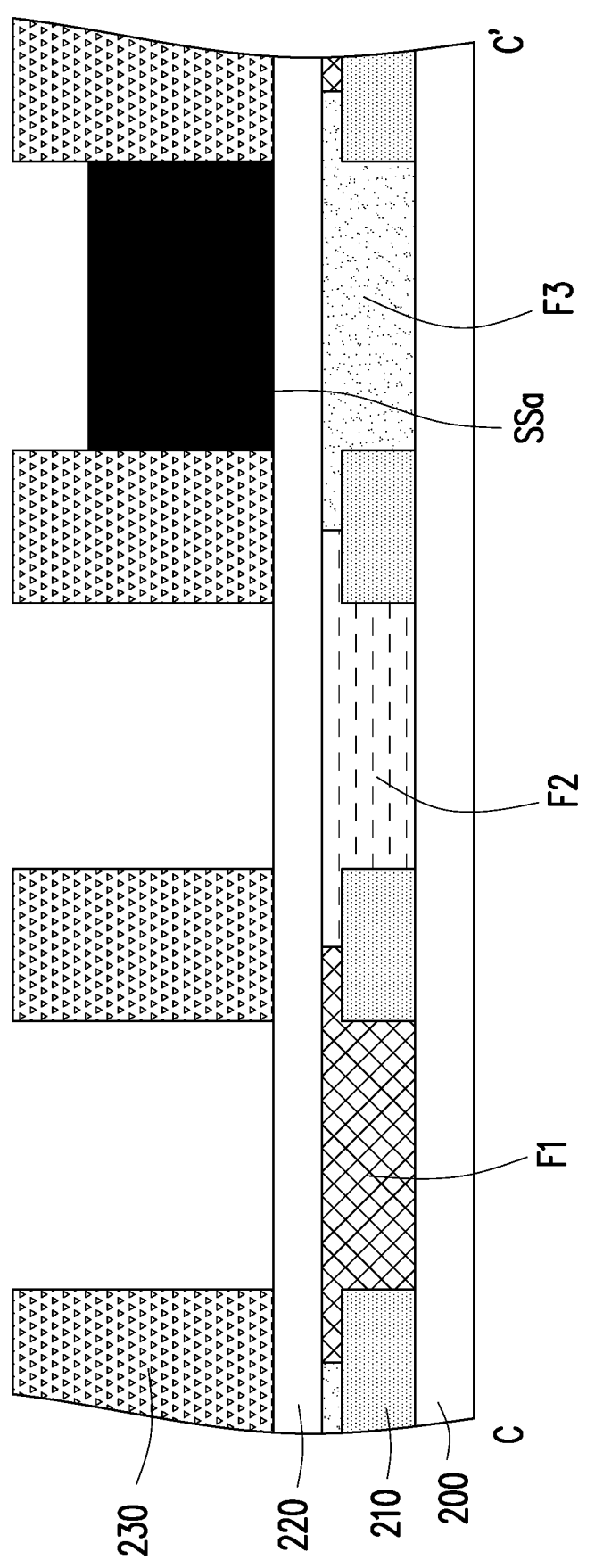

Referring to FIG. 1G and FIG. 2G, a plurality of light-shielding structures SS are formed in the second sub-pixel areas SP2. The plurality of light-shielding structures SS are disposed in the second sub-pixel areas SP2. Each of the light-shielding structures SS is disposed in one corresponding preset opening 232 or in one corresponding repair opening 234, wherein the number of the light-shielding structures SS in each of the second sub-pixel areas SP2 is one. The light-shielding structures SS are disposed in the repair openings 234 of the second sub-pixel areas SP2a of the first portion and in the preset openings 232 of the second sub-pixel areas SP2b of the second portion. Specifically, light-shielding structures SSa of the first portion are disposed in the repair openings 234 of the second sub-pixel areas SP2 of the first portion, and light-shielding structures SSb of the second portion are disposed in the preset openings 232 of the second sub-pixel areas SP2b of the second portion.

Figure 1H:
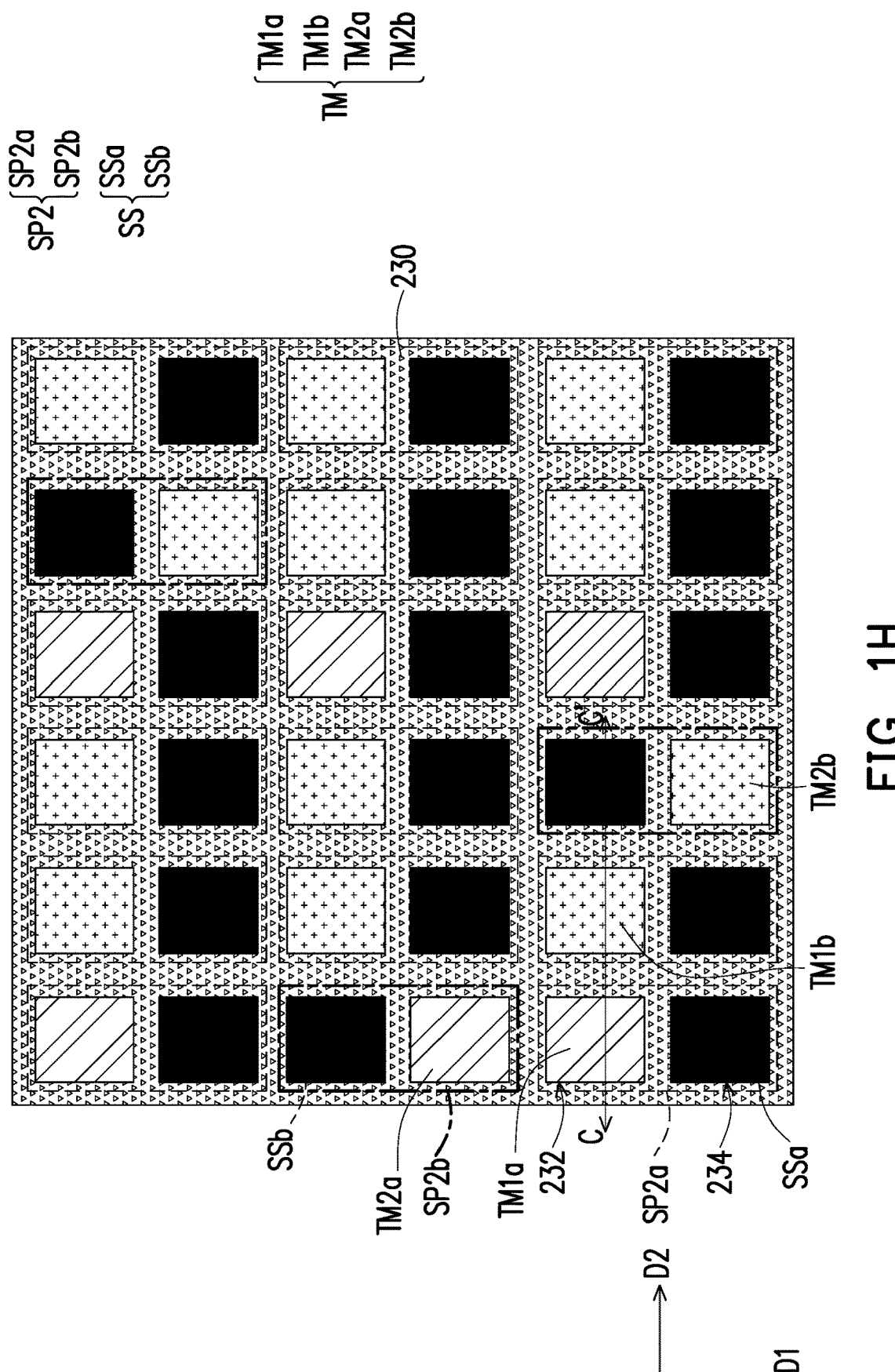
Figure 2H:
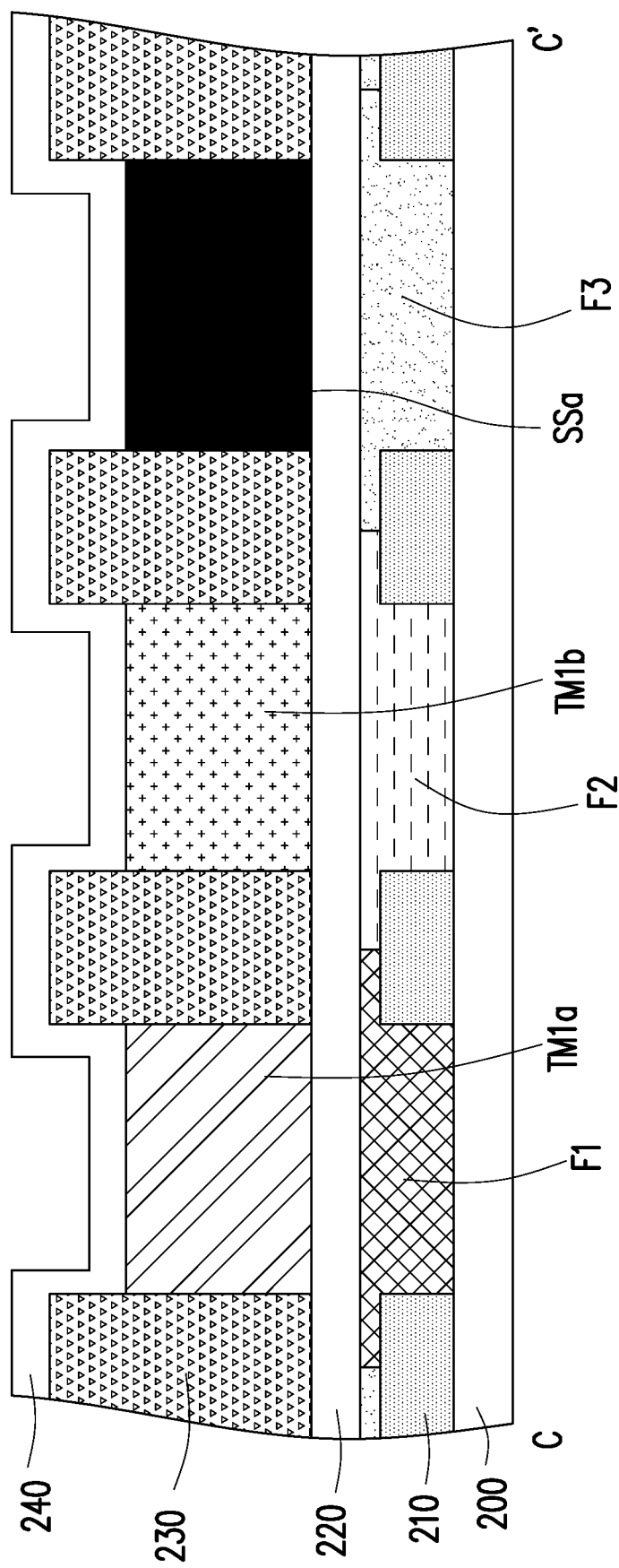

Referring to FIG. 1H and FIG. 2H, a plurality of light-transmission structures TM are formed in the second sub-pixel areas SP2. The plurality of light-transmission structures TM are disposed in the second sub-pixel areas SP2. Each of the light-transmission structures TM is disposed in one corresponding preset opening 232 or in one corresponding repair opening 234, wherein the number of the light-transmission structures TM in each of the second sub-pixel areas SP2 is one. The light-transmission structures TM are disposed in the preset openings 232 of the second sub-pixel areas SP2a of the first portion and in the repair openings 234 of the second sub-pixel areas SP2b of the second portion. Specifically, light-transmission structures TM1a and TM1b of the first portion are disposed in the preset openings 232 of the second sub-pixel areas SP2a of the first portion, and light-transmission structures TM2a and TM2b of the second portion are disposed in the repair openings 234 of the second sub-pixel areas SP2b of the second portion.

In the present embodiment, the light-transmission structures TM include a color conversion material or a scattering material. For example, the light-transmission structures TM1a and the light-transmission structures TM2a include color conversion materials, such as at least one of quantum dot materials, phosphorescent materials, fluorescent materials, dyes, and perovskite materials. In some embodiments, light of a portion of wavelengths may pass through the light-transmission structures TM1a and the light-transmission structures TM2a, and light of another portion of wavelengths is absorbed by the light-transmission structures TM1a and the light-transmission structures TM2a and converted into light of other wavelengths. For example, the light-transmission structures TM1b and the light-transmission structures TM2b include scattering materials. For example, when the light passes through the light-transmission structures TM1b and the light-transmission structures TM2b, scattering phenomenon occurs due to the scattering particles in the light-transmission structures TM1b and the light-transmission structures TM2b. The scattering particles are, for example, porous (or air-containing) silicon oxide $(SiO_2)$, titanium oxide $(TiO_2)$, aluminum oxide $(Al_2O_3)$, calcium carbonate $(CaCO_3)$, barium sulfate $(BaSO_4)$, zirconia $(ZrO_2)$, metal-coated polymer particles, hollow polymer particles, or other reflective microstructures.

In the present embodiment, since the light-shielding structures SS are disposed in the repair openings 234 of the second sub-pixel areas SP2a of the first portion and in the preset openings 232 of the second sub-pixel areas SP2b of the second portion, after the first sub-pixels SP1 and the second sub-pixels SP2 are overlapped (please refer to FIG. 1C and FIG. 3), the light-shielding structures SS may shield the circuit substrate 100 below the repair openings 234 of the second sub-pixel areas SP2a of the first portion and below the preset openings 232 of the second sub-pixel areas SP2b of the second portion, thereby reducing the reflectivity of the display device. Moreover, since there is no need to dispose the light-transmission structures TM in the repair openings 234 of the second sub-pixel areas SP2a of the first portion and the preset openings 232 of the second sub-pixel areas SP2b of the second portion, the usage amount of the light-transmission structures TM may be reduced, thereby reducing the fabrication cost of the display device.

Please continue to refer to FIG. 1H and FIG. 2H, a second protection layer 240 is formed on the bank structure 230, the light-transmission structures TM, and the light-shielding structures SS. In some embodiments, the material of the second protection layer 240 includes silicon oxide, silicon nitride, silicon oxynitride, or other suitable materials.

Figure 3:
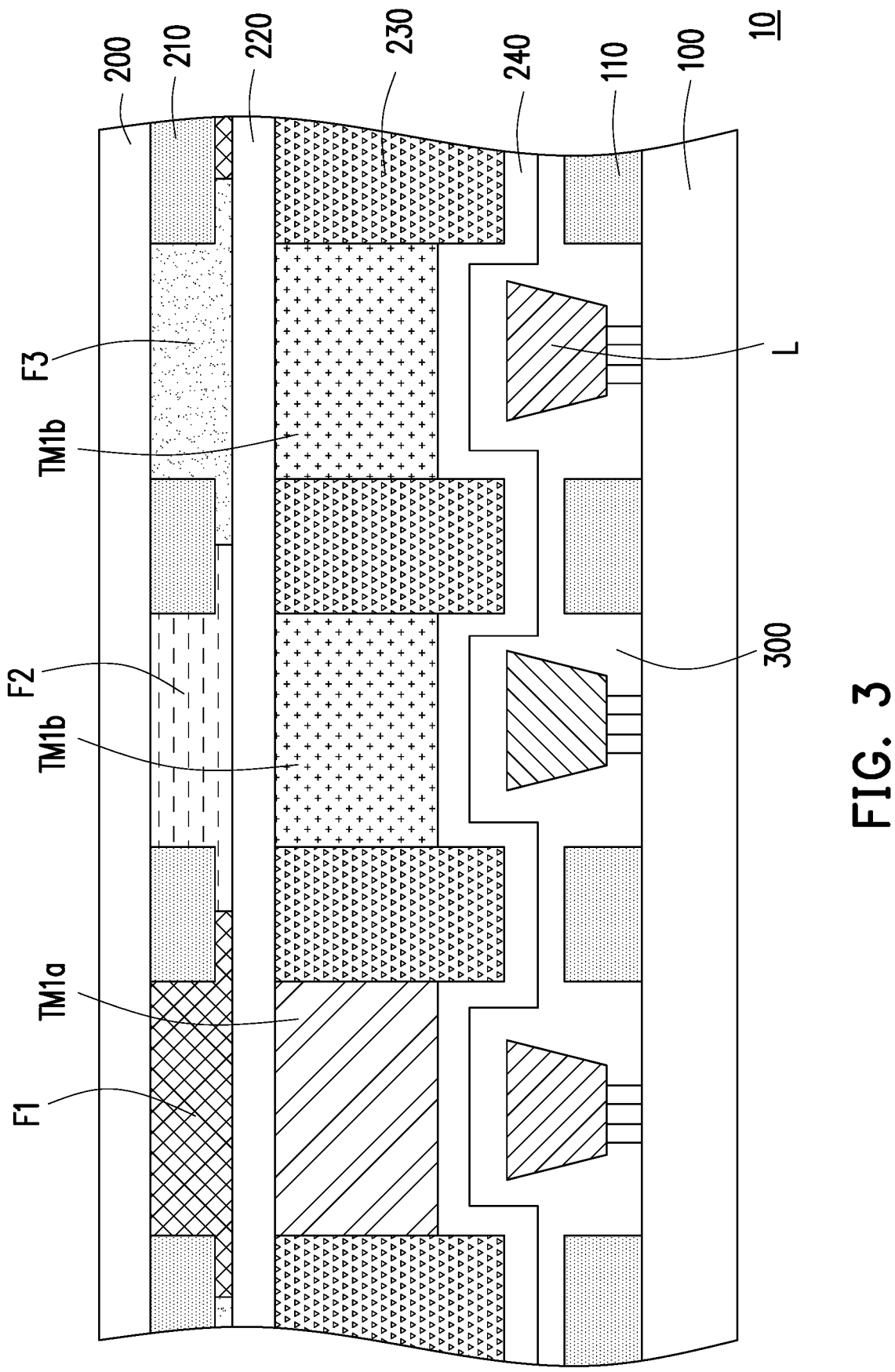
FIG. 3 is a schematic cross-sectional view of a display device according to an embodiment of the invention.

Lastly, the structure shown in FIG. 1H and FIG. 2H (including the cover plate 200, the black matrix 210, the color filter elements F1, F2, F3, the first protection layer 220, the bank structure 230, the light-transmission structures TM, the light-shielding structures SS, and the second protection layer 240) is bonded to the structure shown in FIG. 1C and FIG. 2C (including the circuit substrate 100, the light-emitting diodes L, and the light-shielding layer 110) to obtain the display device 10 as shown in FIG. 3. In some embodiments, an adhesive layer 300 is formed on the light-emitting diodes L, the circuit substrate 100, and the light-shielding layer 110, and then the structure shown in FIG. 1H and FIG. 2H is combined to the structure shown in FIG. 1C and FIG. 2C by using the adhesive layer 300. The adhesive layer 300 is located between the second protection layer 240 and the circuit substrate 100. In some embodiments, before the adhesive layer 300 is formed, a barrier structure (not shown) is formed on the circuit substrate 100 first. The barrier structure is used to limit the range of the adhesive layer 300 to prevent the adhesive layer 300 from overflowing.

In the present embodiment, the first sub-pixel areas SP1 are overlapped with the second sub-pixel areas SP2 respectively. The preset openings 232 of the second sub-pixel areas SP2 are overlapped with the placement areas DP of the first sub-pixel areas SP1, and the repair openings 234 of the second sub-pixel areas SP2 are overlapped with the repair areas RP of the first sub-pixel areas SP1.

Figure 4A:
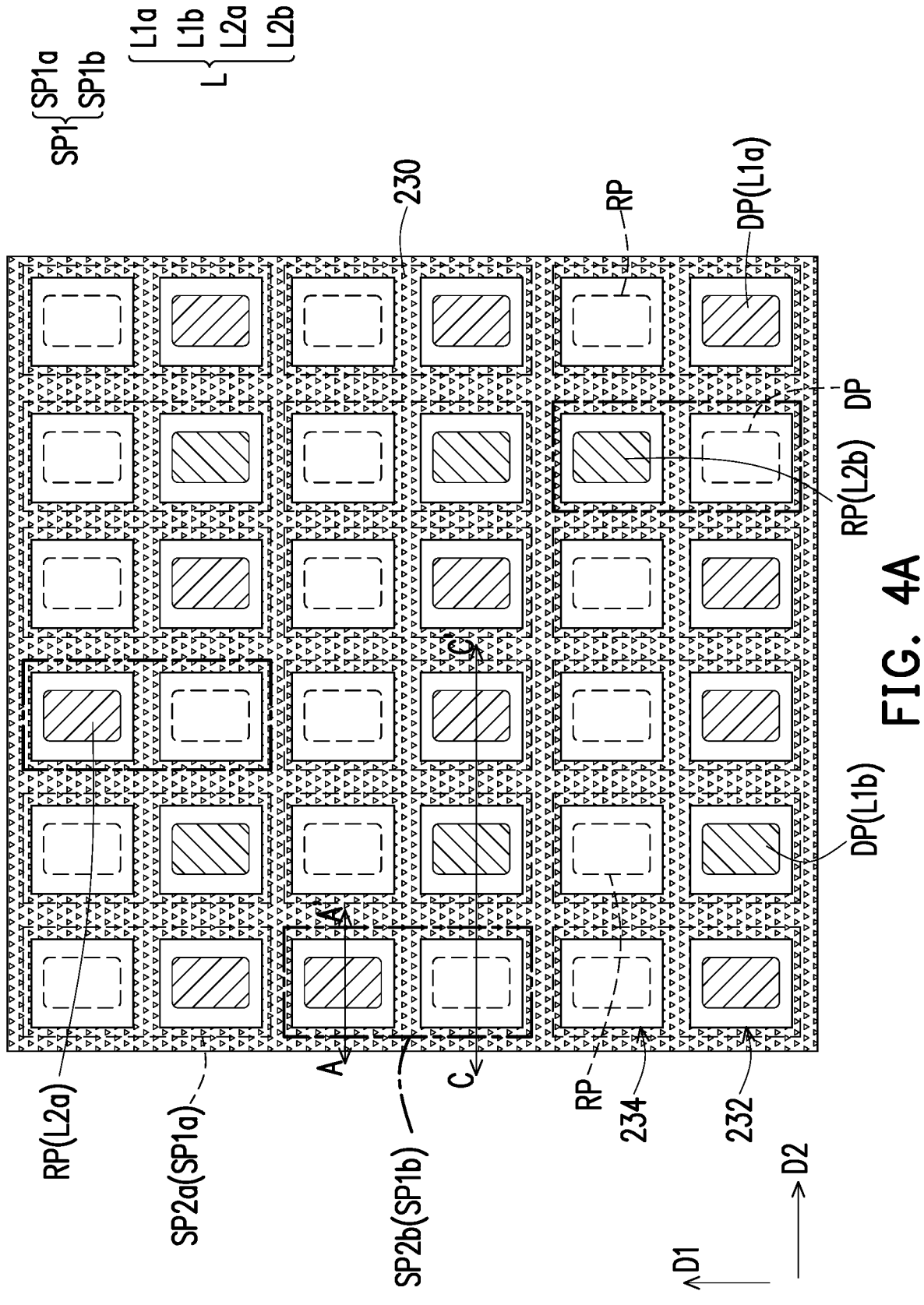
FIG. 4A to FIG. 4C are schematic top views of a fabrication method of a display device according to an embodiment of the invention.
Figure 4B:
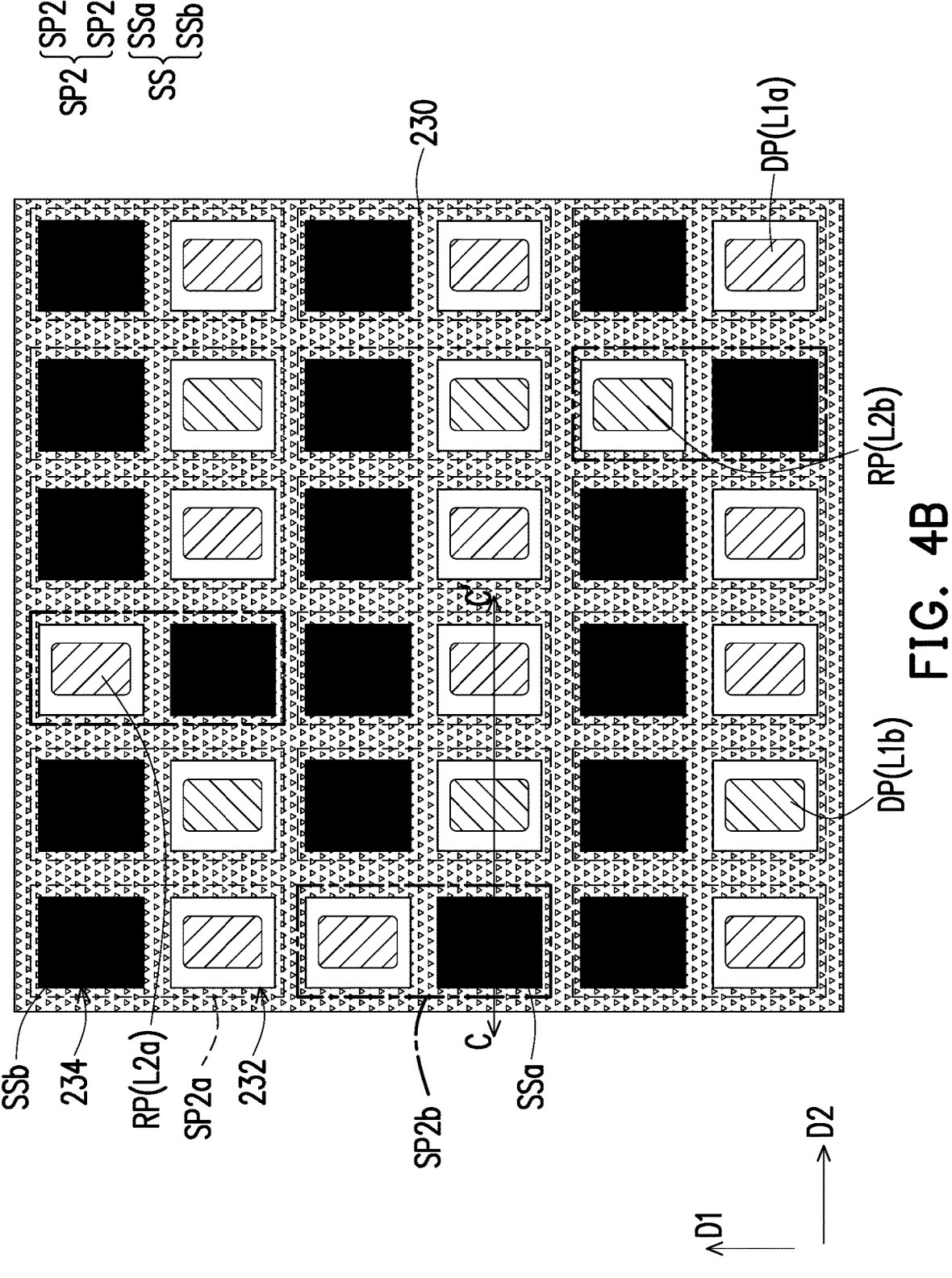
Figure 4C:
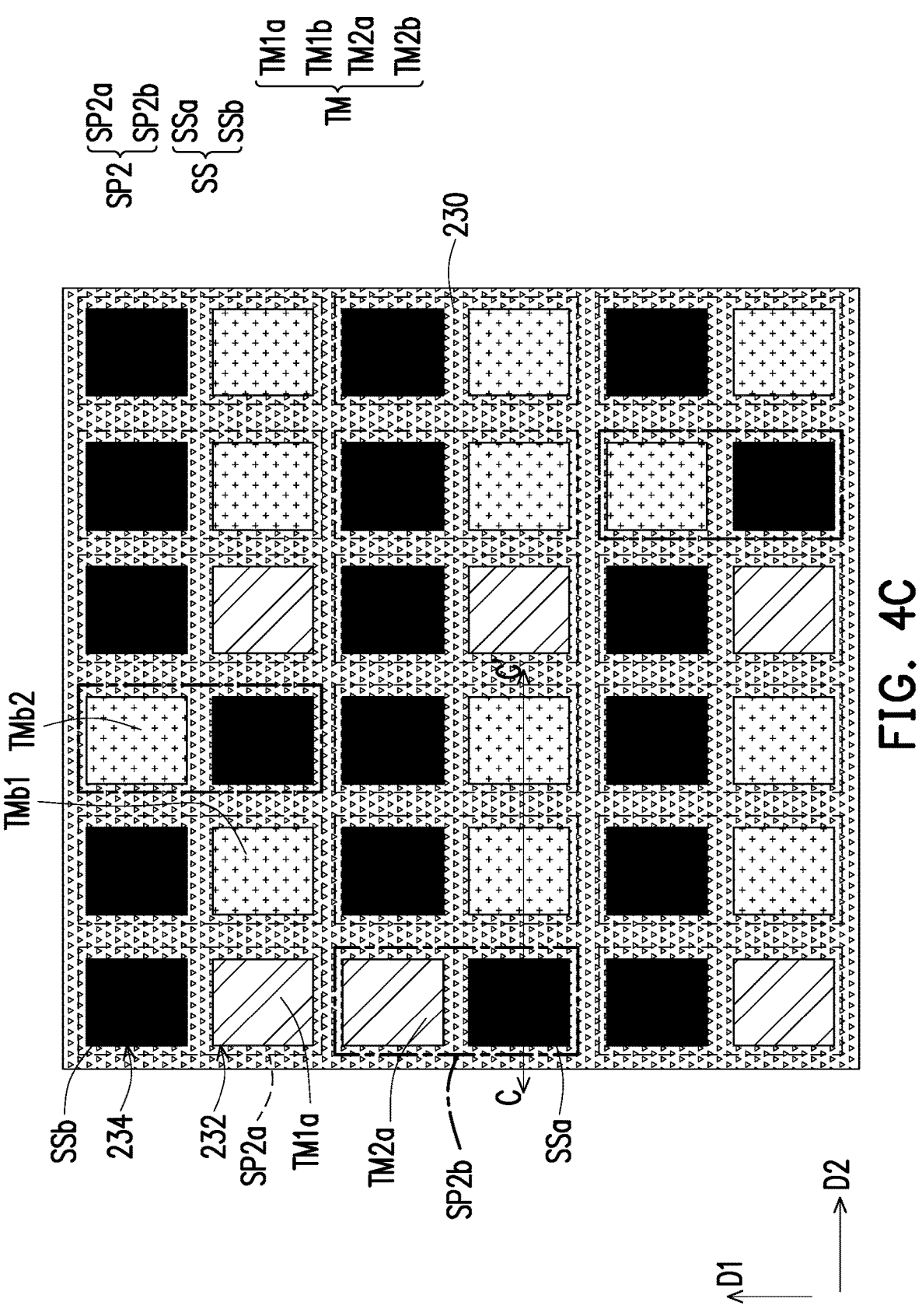
Figure 5A:
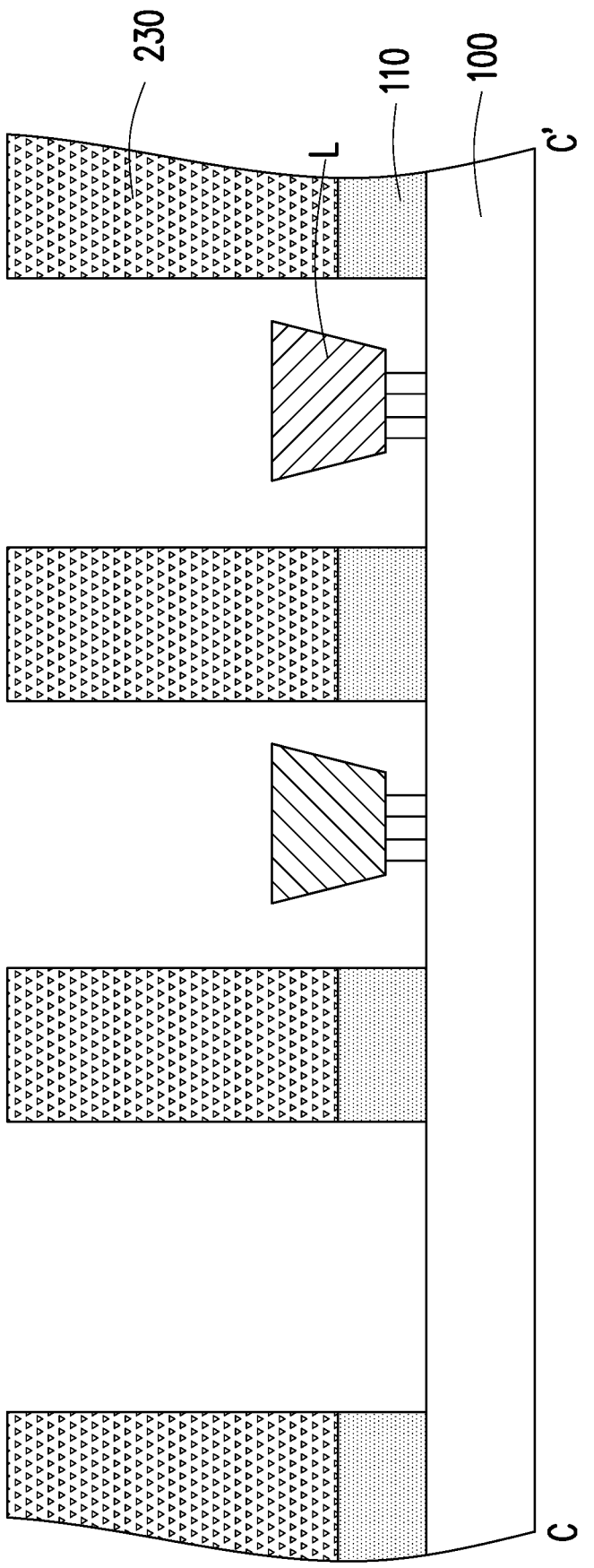
FIG. 5A to FIG. 5C are schematic cross-sectional views of a fabrication method of a display device according to an embodiment of the invention.
Figure 5B:
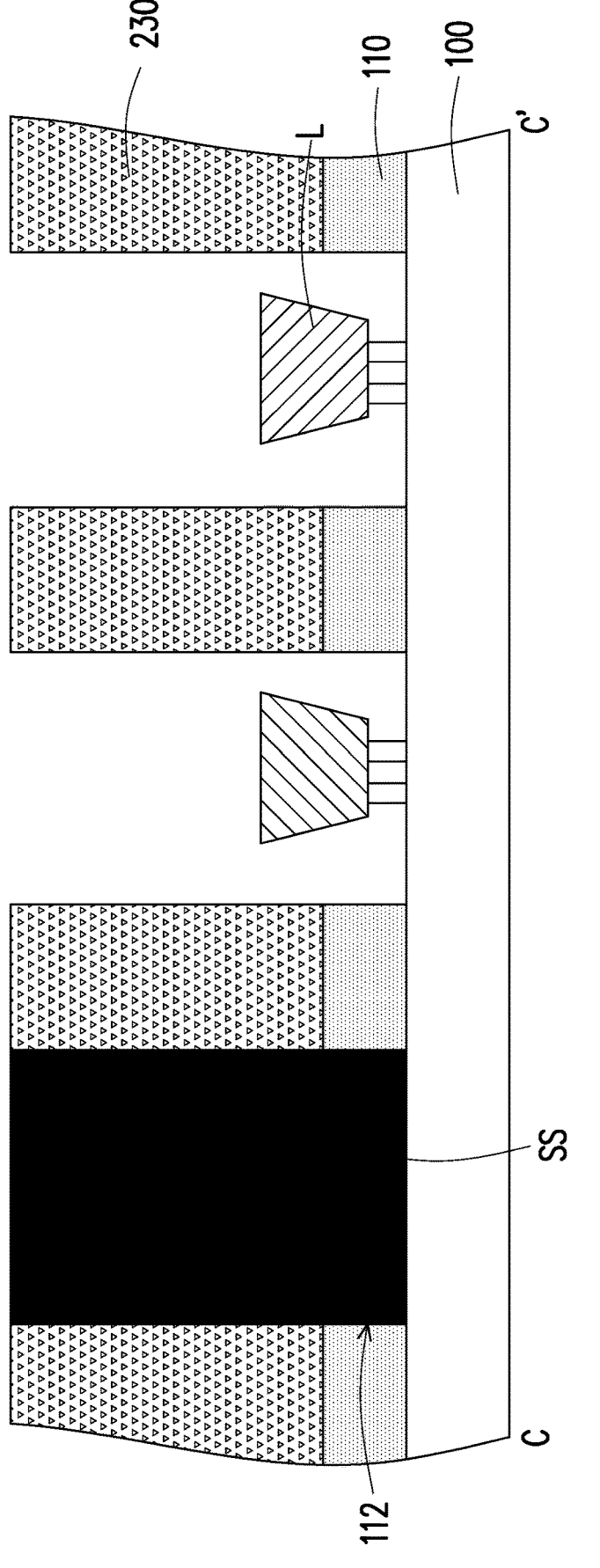
Figure 5C:
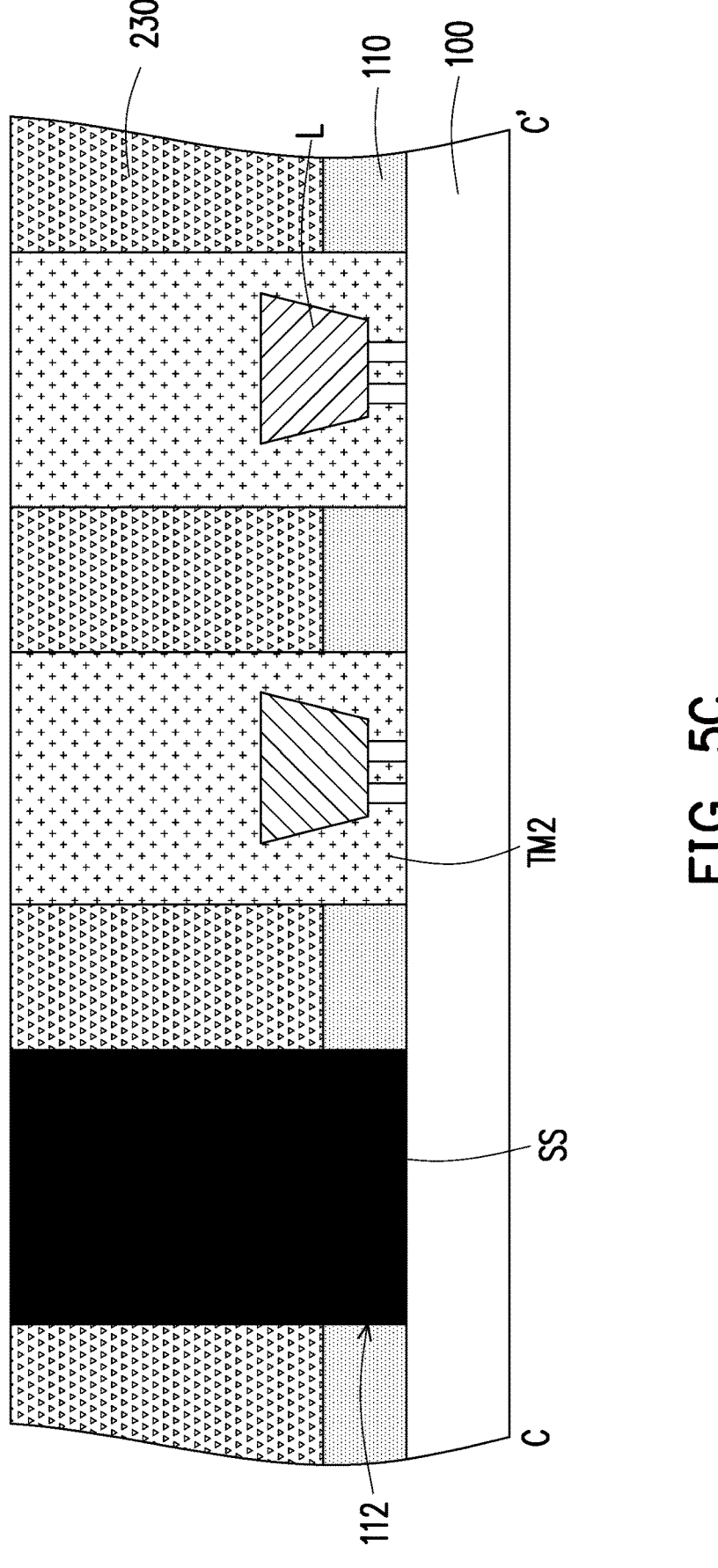

FIG. 4A to FIG. 4C are schematic top views of a fabrication method of a display device according to an embodiment of the invention. FIG. 5A to FIG. 5C are schematic cross-sectional views of a fabrication method of a display device according to an embodiment of the invention. FIG. 5A to FIG. 5C correspond to the position of line C-C' in FIG. 4A to FIG. 4C respectively.

Continuing the steps of FIG. 1C and FIG. 2C, please refer to FIG. 4A and FIG. 5A, in which the bank structure 230 is formed on the light-shielding layer 110. In the present embodiment, the bank structure 230 has the same width as the light-shielding layer 110, but the invention is not limited thereto. In other embodiments, the width of the bank structure 230 is larger or smaller than the width of the light-shielding layer 110.

Based on the distribution of the first sub-pixel areas SP1*a* of the first portion and the first sub-pixel areas SP1*b* of the second portion obtained by the detection process in the steps of FIG. 1B to FIG. 1C, the second sub-pixel areas SP2 are divided into the second sub-pixel areas SP2*a* of the first portion and the second sub-pixel areas SP2*b* of the second portion, wherein the second sub-pixel areas SP2*a* of the first portion are overlapped with the first sub-pixel areas SP1*a* of the first portion, and the second sub-pixel areas SP2*b* of the second portion are overlapped with the first sub-pixel areas SP1*b* of the second portion.

Referring to FIG. 4B and FIG. 5B, the plurality of light-shielding structures SS are formed in the second sub-pixel areas SP2. The plurality of light-shielding structures SS are disposed in the second sub-pixel areas SP2. Each of the light-shielding structures SS is disposed in one corresponding preset opening 232 or in one corresponding repair opening 234, wherein the number of the light-shielding structures SS in each of the second sub-pixel areas SP2 is one. The light-shielding structures SS are disposed in the repair openings 234 of the second sub-pixel areas SP2*a* of the first portion and in the preset openings 232 of the second sub-pixel areas SP2*b* of the second portion. Specifically, the light-shielding structures SSa of the first portion are disposed in the repair openings 234 of the second sub-pixel areas SP2*a* of the first portion, and the light-shielding structures SSb of the second portion are disposed in the preset openings 232 of the second sub-pixel areas SP2*b* of the second portion.

In the present embodiment, the light-shielding structures SS are also filled into a portion of the openings 112 of the light-shielding layer 110. In some embodiments, when a portion of the openings 112 of the light-shielding layer 110 include a failed light-emitting diode, the light-shielding structures SS cover the failed light-emitting diode.

Referring to FIG. 4C and FIG. 5C, the plurality of light-transmission structures TM are formed in the second sub-pixel areas SP2. The plurality of light-transmission structures TM are disposed in the second sub-pixel areas SP2. Each of the light-transmission structures TM is disposed in one corresponding preset opening 232 or in one corresponding repair opening 234, wherein the number of the light-transmission structures TM in each of the second sub-pixel areas SP2 is one. The light-transmission structures TM are disposed in the preset openings 232 of the second sub-pixel areas SP2*a* of the first portion and in the repair openings 234 of the second sub-pixel areas SP2*b* of the second portion. Specifically, the light-transmission structures TM1*a* and TM1*b* of the first portion are disposed in the preset openings 232 of the second sub-pixel areas SP2 of the first portion, and the light-transmission structures TM2*a* and TM2*b* of the second portion are disposed in the repair openings 234 of the second sub-pixel areas SP2*b* of the second portion.

In the present embodiment, the light-transmission structures TM are also filled into a portion of the openings 112 of the light-shielding layer 110. In addition, in the present embodiment, the light-transmission structures TM cover the light-emitting diodes L.

Figure 6:
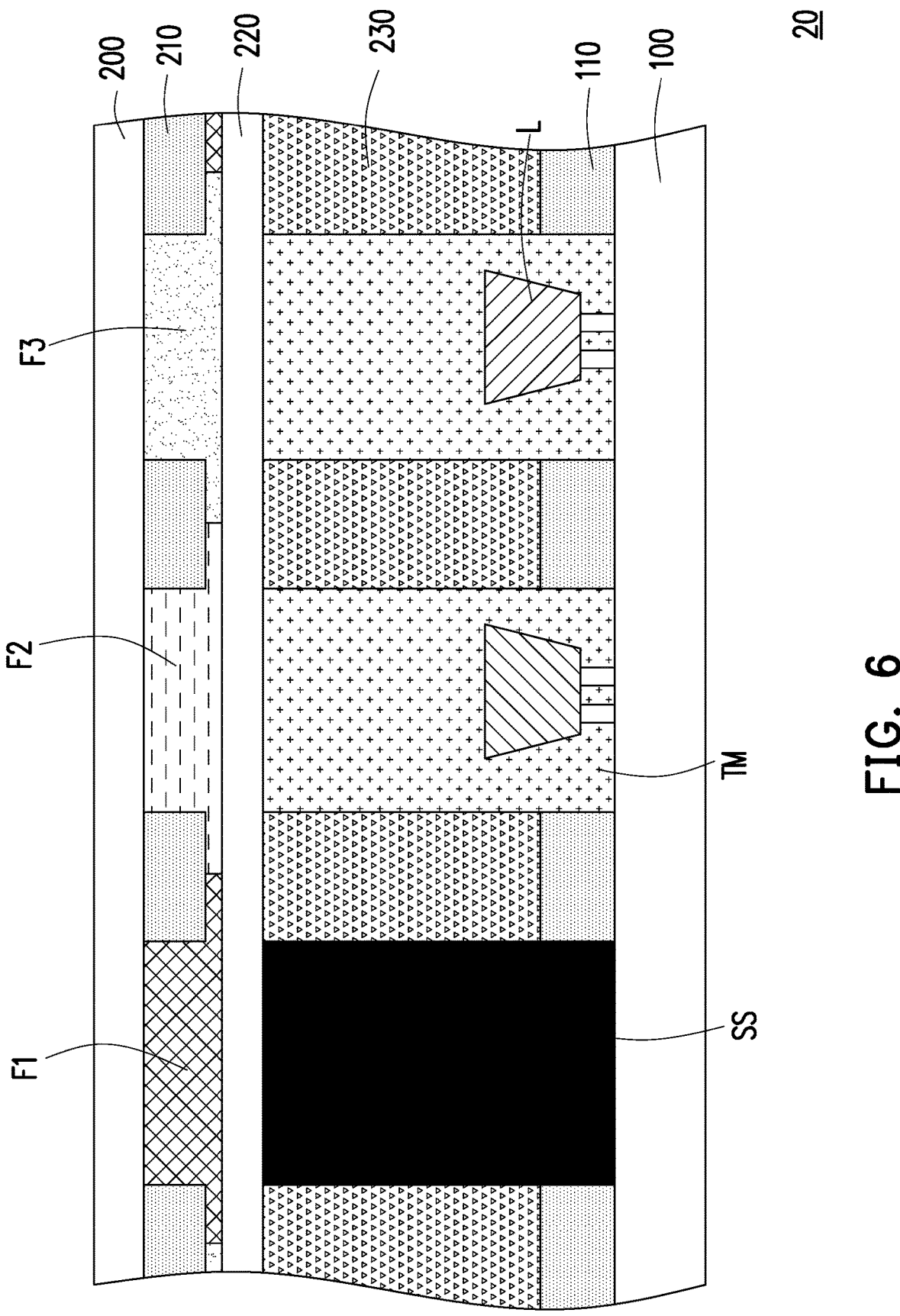
FIG. 6 is a schematic cross-sectional view of a display device according to an embodiment of the invention.

Lastly, the color filter element substrate including the cover plate 200, the black matrix 210, the color filter elements F1, F2, F3, and the first protection layer 220 is combined to the structure shown in FIG. 4C and FIG. 5C (including the circuit substrate 100, the light-emitting diodes L, the light-shielding layer 110, the bank structure 230, the light-transmission structures TM, the light-shielding structures SS) to obtain the display device 20 as shown in FIG. 6.

Figure 7:
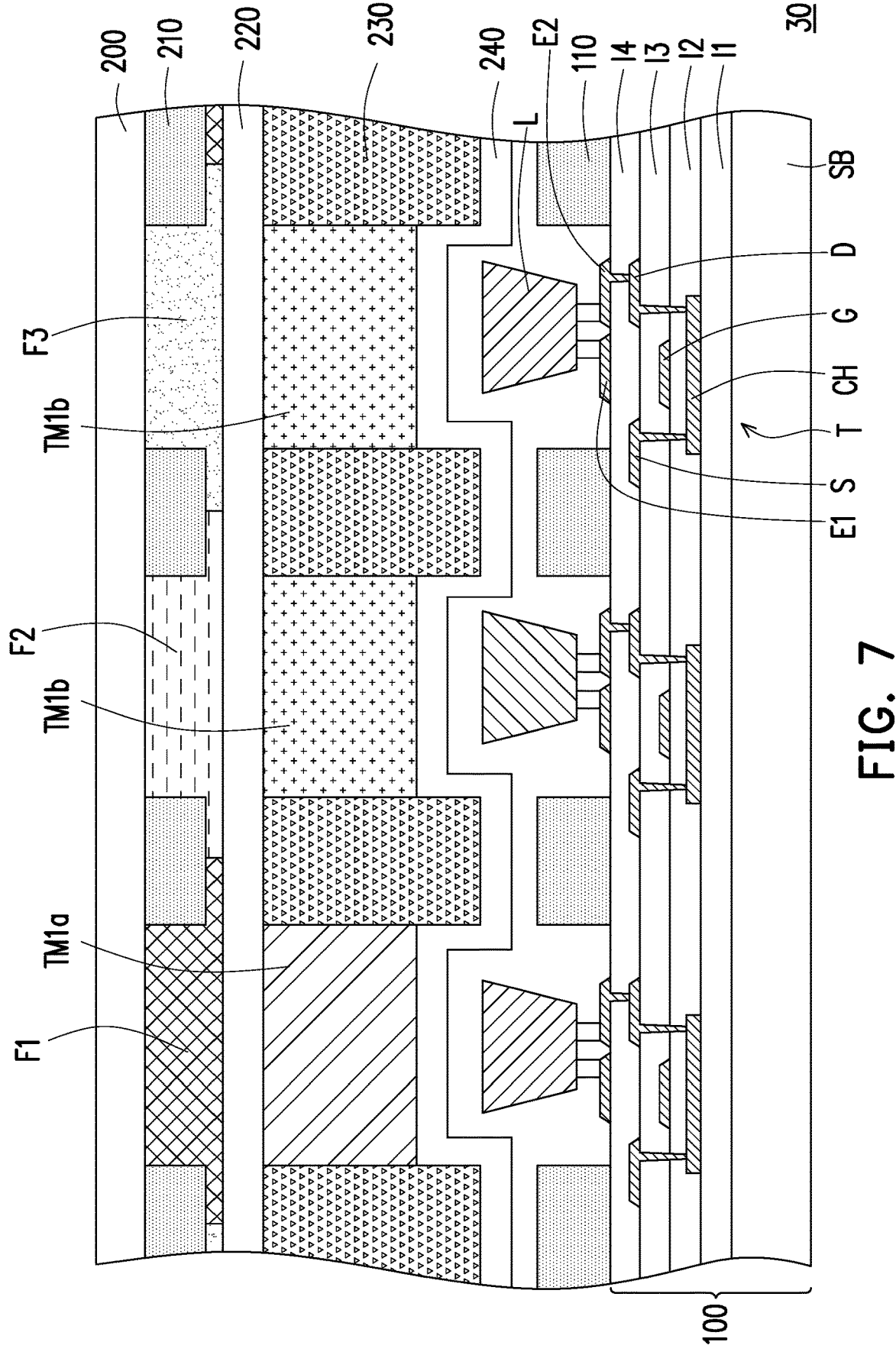
FIG. 7 is a schematic cross-sectional view of a display device according to an embodiment of the invention.

FIG. 7 is a schematic cross-sectional view of a display device 30 according to an embodiment of the invention. It should be mentioned here that, the embodiment of FIG. 7 adopts the reference numerals of the embodiment of FIG. 3 and a portion of the contents thereof, wherein the same or similar reference numerals are used to represent the same or similar elements and descriptions of the same technical contents are omitted. The omitted portions are as described in the above embodiments and are not repeated herein.

Please refer to FIG. 7, in the present embodiment, the circuit substrate 100 includes a carrier board SB and thin-film transistors T located on the carrier board SB. Each of the thin-film transistors T includes a channel CH, a gate G, a source S, and a drain D.

A first insulating layer I1 is located on the carrier board SB. The channel CH is located on the first insulating layer I1. A second insulating layer I2 is located on the channel CH. The gate G is located on the second insulating layer I2 and overlapped with the channel CH. A third insulating layer I3 is located on the gate G. The source S and the drain D are located on the third insulating layer I3 and electrically connected to the channel CH.

In the present embodiment, the thin-film transistors T are top-gate thin-film transistors, but the invention is not limited thereto. In other embodiments, the thin-film transistors T are bottom-gate thin-film transistors, double-gate thin-film transistors, or other types of thin-film transistors.

A fourth insulating layer I4 is located on the thin-film transistors T. Electrodes E1 and E2 are located on the fourth insulating layer I4. The electrodes E1 and E2 electrically connect the thin-film transistors T to the light-emitting diodes L. In some embodiments, the circuit substrate 100 may further include other active elements and passive elements.

Figure 8:
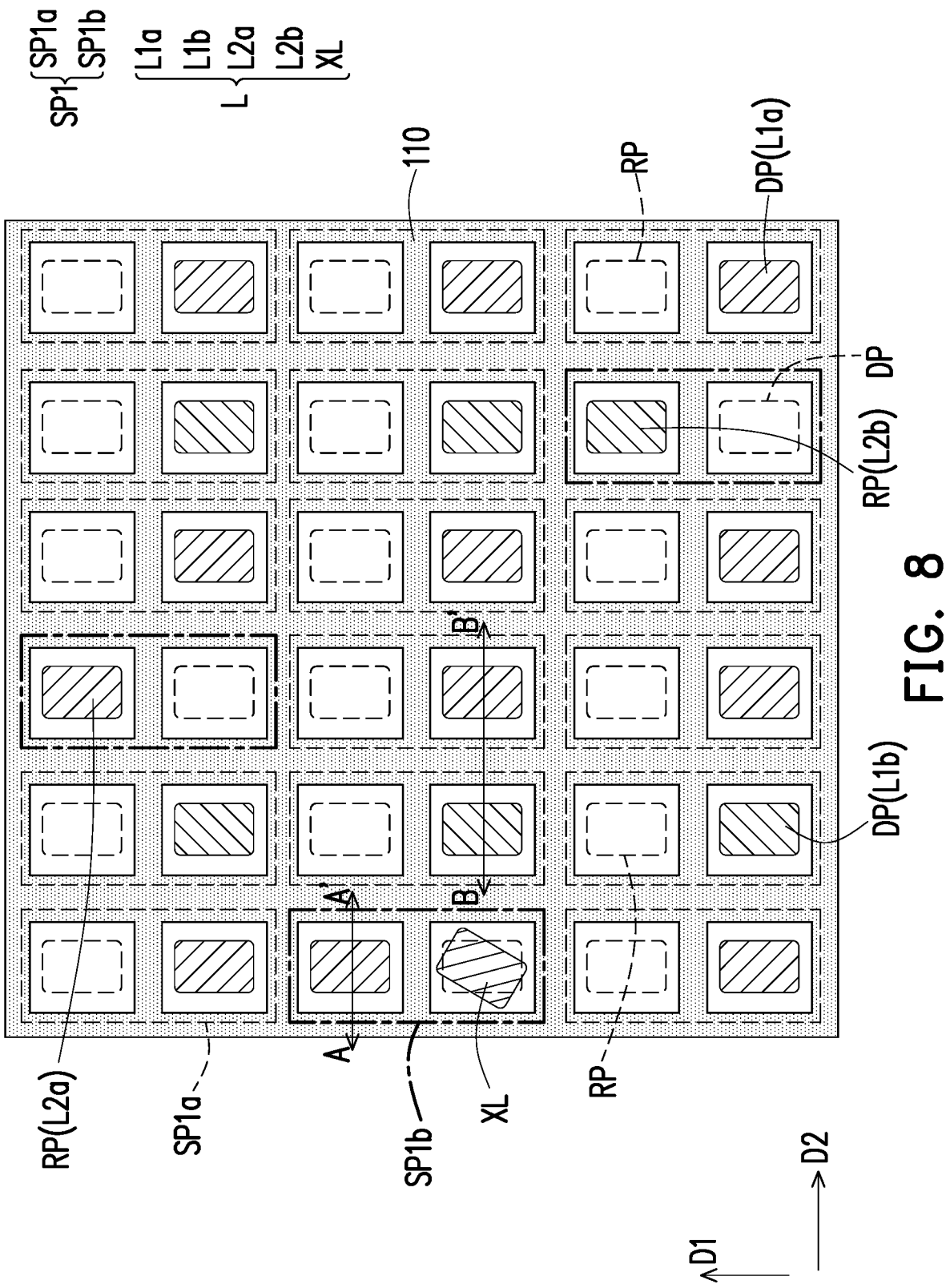
FIG. 8 is a schematic top view of a fabrication method of a display device according to an embodiment of the invention.

FIG. 8 is a schematic top view of a fabrication method of a display device according to an embodiment of the invention. The main difference between the embodiment of FIG. 8 and the embodiment of FIG. 1A to FIG. 1C is that, in the embodiment of FIG. 8, after the light-emitting diodes L are transferred, two corresponding light-emitting diodes L are respectively disposed on the placement area DP and the repair area RP of one of the first sub-pixel areas SP1. For example, in one of the first sub-pixels SP1*b* of the second portion, a damaged or crooked light-emitting diode XL is disposed on the placement area DP, and a normal light-emitting diode L2*a* is disposed on the repair area RP.

Next, the steps shown in FIG. 1D to FIG. 1H are performed to form a display device. In the present embodiment, the damaged or crooked light-emitting diode XL is overlapped with the light-shielding structures SS, and is not overlapped with the light-transmission structures TM.

Based on the above, in the display device of the invention, the light-shielding structures may shield the circuit substrate below the repair openings of the second sub-pixel areas of the first portion and the preset openings of the second sub-pixel areas of the second portion, thereby reducing the reflectivity of the display device. Moreover, since there is no need to dispose the light-transmission structures in the repair openings of the second sub-pixel areas of the first portion and in the preset openings of the second sub-pixel areas of the second portion, the usage amount of the light-transmission structures can be reduced, thereby reducing the fabrication cost of the display device.

What is claimed is:

1. A display device, comprising:
a circuit substrate, wherein the circuit substrate comprises a plurality of first sub-pixel areas, and each of the first sub-pixel areas comprises a placement area and a repair area;
a plurality of light-emitting diodes, wherein at least one corresponding light-emitting diode is disposed on at least one of the placement area and the repair area of each of the first sub-pixel areas;
a bank structure located on the circuit substrate and having a plurality of second sub-pixel areas, wherein the first sub-pixel areas are respectively overlapped with the second sub-pixel areas, each of the second sub-pixel areas comprises a preset opening and a repair opening, the preset openings are overlapped with the placement areas, and the repair openings are overlapped with the repair areas; and
a plurality of light-transmission structures disposed in the second sub-pixel areas, wherein each of the light-transmission structures is disposed in one corresponding preset opening or in one corresponding repair opening, and a number of the light-transmission structures in each of the second sub-pixel areas is one.

2. The display device of claim 1, further comprising:
a plurality of light-shielding structures disposed in the repair openings of the second sub-pixel areas of a first portion and in the preset openings of the second sub-pixel areas of a second portion.

3. The display device of claim 2, wherein the light-transmission structures are disposed in the preset openings of the second sub-pixel areas of the first portion and in the repair openings of the second sub-pixel areas of the second portion.

4. The display device of claim 1, wherein two corresponding light-emitting diodes are respectively disposed on the placement area and the repair area in one of the first sub-pixel areas.

5. The display device of claim 4, wherein the light-emitting diode on the placement area of the one of the first sub-pixel areas is a damaged or crooked light-emitting diode.

6. The display device of claim 5, further comprising:
a plurality of light-shielding structures disposed in the repair openings of the second sub-pixel areas of a first portion and in the preset openings of the second sub-pixel areas of a second portion, wherein the damaged or crooked light-emitting diode is overlapped with the light-shielding structures and not overlapped with the light-transmission structures.

7. The display device of claim 1, wherein the light-transmission structures comprise a quantum dot material, a phosphorescent material, a fluorescent material, a dye, a perovskite material, or a scattering material.

8. The display device of claim 1, further comprising:
a cover plate;
a black matrix located on the cover plate;
a color filter element located on the cover plate;
a first protection layer located on the color filter element, and the bank structure is formed on the first protection layer;
a second protection layer located on the bank structure and the light-transmission structures; and
an adhesive layer located between the second protection layer and the circuit substrate.

9. The display device of claim 1, further comprising:
a color filter element overlapped with the light-emitting diodes, wherein the color filter element comprises:
a plurality of red filter layers, a plurality of green filter layers, and a plurality of blue filter layers extended along a first direction, wherein the placement areas and the repair areas are alternately arranged in the first direction, and the preset openings and the repair openings are also alternately arranged in the first direction.

10. The display device of claim 1, further comprising:
a light-shielding layer surrounding the light-emitting diodes, and the bank structure is formed on the light-shielding layer.

11. The display device of claim 1, further comprising:
a light-shielding layer surrounding the light-emitting diodes, wherein the light-shielding layer has a plurality of openings, and each of the placement areas and the repair areas is overlapped with one corresponding opening, and in each of the first sub-pixels, the placement area and the repair area are separated by the light-shielding layer.

12. A fabrication method of a display device, comprising:
providing a circuit substrate, wherein the circuit substrate comprises a plurality of first sub-pixel areas, and each of the first sub-pixel areas comprises a placement area and a repair area;
disposing a plurality of light-emitting diodes on the circuit substrate, comprising:
performing one or a plurality of transfer processes, wherein the light-emitting diodes of a first portion are successfully disposed on the placement areas of the first sub-pixel areas of a first portion after the transfer process;
performing a detection process to confirm that the first sub-pixel areas of a second portion of the light-emitting diodes that may function normally are not successfully disposed after the one or plurality of transfer processes;
performing one or a plurality of repair processes to dispose the light-emitting diodes of a second portion on the repair areas of the first sub-pixel areas of the second portion;
forming a bank structure, wherein the bank structure has a plurality of second sub-pixel areas, each of the second sub-pixel areas comprises a preset opening and a repair opening, the preset openings correspond to the placement areas, and the repair openings correspond to the repair areas;
forming a plurality of light-transmission structures in the second sub-pixel areas, wherein the light-transmission structures are disposed in the preset openings of the second sub-pixel areas of a first portion and in the repair openings of the second sub-pixel areas of a second portion, positions of the second sub-pixel areas of the first portion correspond to positions of the first sub-pixel areas of the first portion, and positions of the second sub-pixel areas of the second portion correspond to positions of the first sub-pixel areas of the second portion.

13. The fabrication method of claim 12, further comprising:

forming a black matrix and a color filter element on a cover plate;

forming a first protection layer on the color filter element;

forming the bank structure on the first protection layer;

forming a second protection layer on the bank structure and the light-transmission structures;

combining the cover plate, the black matrix, the color filter element, the first protection layer, the bank structure, the light-transmission structures, and the second protection layer with the circuit substrate and the light-emitting diodes.

14. The fabrication method of claim 12, further comprising:

forming a plurality of light-shielding structures in the second sub-pixel areas, wherein the light-shielding structures are disposed in the repair openings of the second sub-pixel areas of the first portion and in the preset openings of the second sub-pixel areas of the second portion.

15. The fabrication method of claim 12, further comprising:

forming a light-shielding layer on the circuit substrate; and forming the bank structure on the light-shielding layer.

\* \* \* \* \*